(12) United States Patent
Chien et al.

(10) Patent No.: US 6,248,623 B1
(45) Date of Patent: Jun. 19, 2001

(54) METHOD FOR MANUFACTURING EMBEDDED MEMORY WITH DIFFERENT SPACER WIDTHS

(75) Inventors: Sun-Chieh Chien; Chien-Li Kuo, both of Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/439,170

(22) Filed: Nov. 12, 1999

(51) Int. Cl.[7] .................................................. H01L 2/8242
(52) U.S. Cl. ............................................ 438/241; 438/266
(58) Field of Search .................................... 438/241, 266, 438/303, 583, 651, 301, 279, 306, 290, 595

(56) References Cited

U.S. PATENT DOCUMENTS

| | | | |
|---|---|---|---|
| 5,899,722 | * 5/1999 | Huang | 438/305 |
| 5,972,764 | * 10/1999 | Huang et al. | 438/305 |
| 6,017,790 | * 1/2000 | Liou et al. | 438/240 |
| 6,020,242 | * 2/2000 | Tsai et al. | 438/279 |
| 6,030,867 | * 2/2000 | Chien et al. | 438/255 |

* cited by examiner

Primary Examiner—David Nelms
Assistant Examiner—David Nhu
(74) Attorney, Agent, or Firm—Thomas, Kayden, Horstemeyer & Risley, LLP

(57) ABSTRACT

A method of manufacturing an embedded memory. A substrate has a memory cell region and a logic circuit region. A plurality of first gate structures and a plurality of second gate structures are respectively formed on the substrate in the memory cell region and the logic circuit region. Every space between the first gate structures is smaller than those between the second gate structures. A first spacer is formed over a sidewall of each first gate structure and over a sidewall of each second gate structure. Several lightly doped drain regions are formed in the substrate exposed by the first spacers and the second gate structures in the logic circuit region. A second spacer is formed on each first spacer in the logic circuit region and a silicide block is simultaneously formed to fill space between the first gate structures in the memory cell region. A source/drain region is formed in the substrate exposed by the second spacers, the first spacers and the second gate structures in the logic circuit region. A silicide layer is formed on the substrate exposed by the second spacers, the first spacers and the second gate structures in the logic circuit region.

22 Claims, 1 Drawing Sheet

METHOD FOR MANUFACTURING EMBEDDED MEMORY WITH DIFFERENT SPACER WIDTHS

BACKGROUND OF THE INVENTION

1. Field of Invention

The present invention relates to a method for manufacturing a semiconductor. More particularly, the present invention relates to a method for manufacturing an embedded memory with different spacer widths.

2. Description of Related Art

In order to decrease the semiconductor manufacturing cost and simplify the fabrication procedures, a method for putting memory and logic devices together on a semiconductor chip is developed.

Typically, an embedded DRAM comprises a memory device region and a logic circuit region. The memory devices and the logic devices are together formed on the same wafer. The benefits of the embedded DRAM include high yield, short cycle time and low manufacturing cost. However, the specific requirements of the memory devices and the logic devices are different from each other, so that the procedures for manufacturing the embedded DRAM must be modified to fit those requirements. Taking the logic device as an example, the logic device requires a relatively high operation rate. Therefore, it is necessary to form a silicide layer on the surface of the source/drain region in the logic device. However, the formation of the silicide layer on the surface of the source/drain region in the memory device leads to a leakage issue for the capacitor. Hence, before forming a silicide layer on the surface of the source/drain region, it is necessary to additionally form a protective layer such as a silicon nitride layer over the memory device region in the embedded DRAM. The protective layer is then removed after the silicide layer is formed.

Additionally, with the increase in the integration, the line width and the space between the gate structures are decreased. The spacer width of the spacer formed on the sidewall of the gate structure must be decreased to provide enough space for forming a bit line contact or a storage node contact. However, the space width of the logic device is not decreased when decreasing the size of the embedded DRAM because the logic device with a high performance must fit the requirement of high operation rate and large process window. Therefore, it is difficult to simultaneously form a memory device and a logic device in an embedded DRAM.

SUMMARY OF THE INVENTION

The invention provides a method of manufacturing an embedded memory with different spacer widths. A substrate having a memory cell region and a logic circuit region is provided. A plurality of first gate structures and a plurality of second gate structures are respectively formed on the substrate in the memory cell region and the logic circuit region. Every space between the first gate structures is smaller than that between the second gate structures. A first spacer is formed over a sidewall of each first gate structure and over a sidewall of each second gate structure. Several lightly doped drain regions are formed in the substrate exposed by the first spacers and the second gate structures in the logic circuit region. A second spacer is formed on each first spacer in the logic circuit region and a silicide block is simultaneously formed to fill spacers between the first gate structures in the memory cell region. A source/drain is formed in the substrate exposed by the second spacers, the first spacers and the second gate structures in the logic circuit region. A silicide layer is formed on the substrate exposed by the second spacers, the first spacers and the second gate structures in the logic circuit region.

In the invention, the spacers with different widths are formed by a two-step formation process to simultaneously meet the spacer width requirements of the logic circuit device and the memory device. Therefore, the operation performances of the logic circuit device and the memory device can be greatly improved.

Additionally, because the silicide block formed to fill the spaces between the first gate structures can protect the memory cell region from forming the silicide layer, the silicide layer is merely formed in the logic circuit region. Hence, the operation rate of the logic circuit device is increased and the subsequently formed capacitor in the memory cell region possesses a relatively long refresh cycle.

Furthermore, the first spacers are used as lightly doped drain offset spacers, so that the overlay capacitor between the source/drain regions and the second gate structures is reduced. Therefore, the operation rate of the logic circuit device is increased and the hot carrier effect can be avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
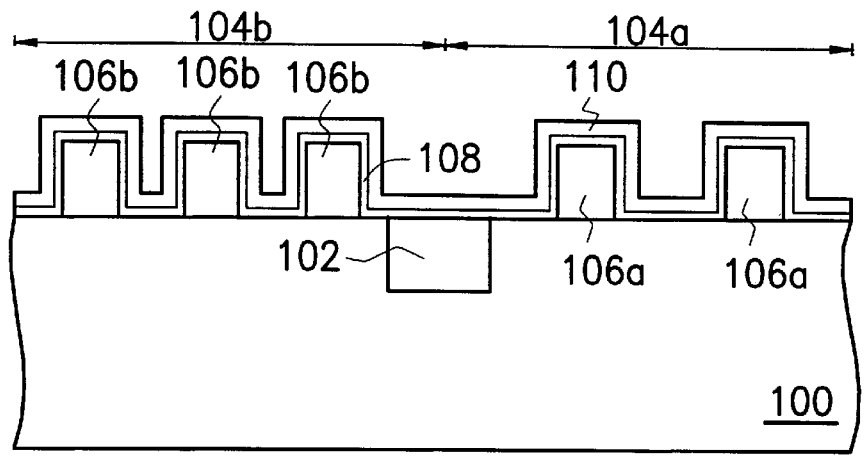
FIGS. 1A through 1C are schematic, cross-sectional views of the process for manufacturing an embedded memory with different spacer widths.
Figure 1B:
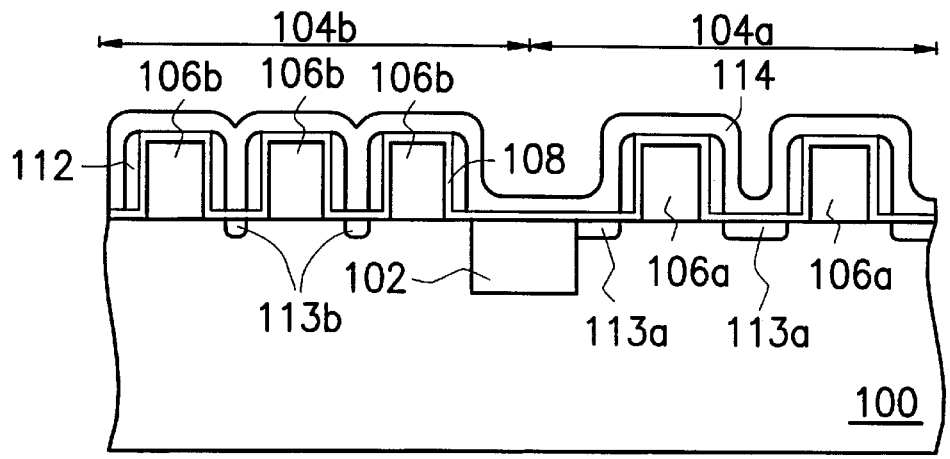
Figure 1C:
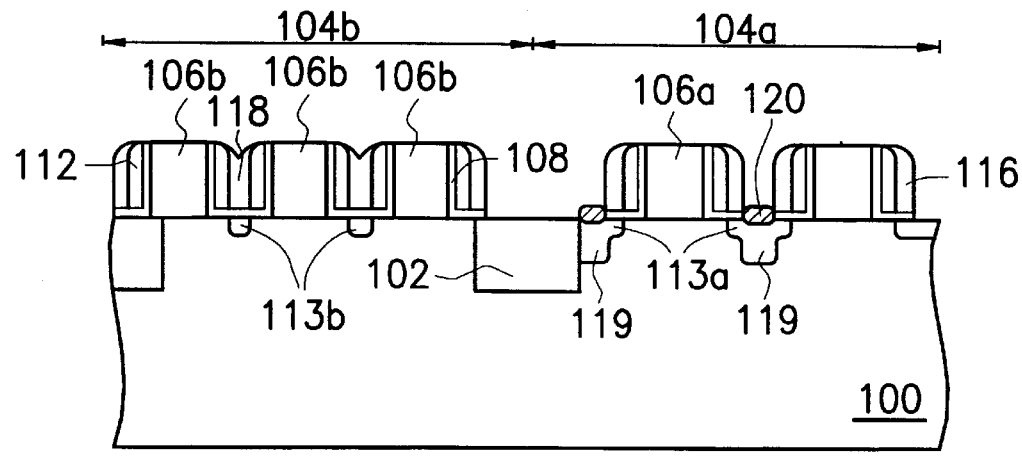

FIGS. 1A through 1C are schematic, cross-sectional views of the process for manufacturing an embedded memory with different spacer widths.

As shown in FIG. 1A, a substrate 100 having a logic circuit region 104a and a memory cell region 104b is provided. The logic circuit region 104a and the memory cell region 104b are isolated from each other by an isolation structure 102. Several gate structures 106a and 106b are respectively formed on the substrate 100 in the logic circuit region 104a and memory cell region 104b. Notably, the spaces between the gate structures 106a formed in the logic circuit region 104a are larger than those between the gate structures 106b formed in the memory cell region 104b. Additionally, the gate structures 106a comprise a polysilicon layer, a polycide layer and a nitride cap layer from the bottom to the top of the gate structures 106a. The polycide layer is used to improve the resistance of the gate structure so that the polysilicon layer can be made of titanium silicon, for example. Moreover, the gate structures 106b comprise a polysilicon layer and a nitride cap layer from the bottom to the top of the gate structures 106b.

A buffer layer 108 is conformally formed over the substrate 100. The buffer layer 108 can be a silicon oxide layer formed by chemical vapor deposition (CVD), for example. A nitride layer 110 is conformally formed on the buffer layer 108. The nitride layer 110 can be formed from silicon nitride by CVD, for example. The thickness of the nitride layer 110 can be varied with the requirement for a manufacturing process of a memory cell. Preferably, the thickness of the nitride layer 110 is about 400–600 angstroms.

As shown in FIG. 1B, a portion of the nitride layer 110 is removed to form spacers 112 on the sidewalls of the gate structures 106a and 106b by using the buffer layer 108 as an etching stop layer. The method of removing the portion of the nitride layer 110 can be an etching back, for example. Incidentally, the thickness of the spacers 112 is proper for providing substantial space for subsequently forming bit line contacts and storage node contacts between the gate structures 106b.

Doped regions 113a are formed in a portion of the substrate 100 beneath the buffer layer 108 exposed by the gate structures 106a and spacers 112 in the logic circuit region 104a. Simultaneously, doped regions 113b are formed in a portion of the substrate 100 beneath the buffer layer 108 exposed by the gate structures 106b and the spacers 112. The method of forming the doped regions 113a and 113b can be an ion implantation process, for example. The doped regions 113a are used as lightly doped drain (LDD) regions in the logic circuit region 104a and the doped regions 113b are used as source/drain regions in the memory device region 104b.

Since the spaces between the spacers 112 formed on the sidewalls of the gate structures 106b are relatively narrow, the concentration of the doped region 113b is relatively low. Because of the relatively low concentration of the doped region 113b, the leakage issue of the memory cell can be overcome.

The typical LDD region is formed in a portion of the substrate adjacent to another portion of the substrate beneath the gate structure. Since the typical LDD region will laterally diffuse and the margin of the typical LDD region expands into the portion of the substrate beneath a portion of the gate structure, there is an overlay capacitor ($C_{GD}$) between the subsequently formed source/drain region and the gate structure. Therefore, the operation rate of the logic circuit device is slow.

In the invention, the doped regions 113a used as LDD regions in the logic circuit region 104a are separated from the gate structures 106a by the spacers 112. The spacers 112 are used as LDD offset spacers, so that the margin of the doped regions 113a do not expand into a portion of the substrate 100 beneath the gate structures 106a when the lateral diffusion of the doped regions 113a occurs. Additionally, the subsequently formed source/drain regions in the logic circuit region 104a can be kept off the gate structures 106a. Hence, the $C_{GD}$ between the source/drain regions and the gate structures is reduced. Therefore, the operation rate of the logic circuit device is increased and the hot carrier effect can be avoided.

An oxide layer 114 is formed over the substrate 100. Since the spaces between the gate structures 106b are relatively small, the oxide layer 114 fills the spaces between the gate structures 106b. However, the spaces between the gate structures 106a are relatively large, so that the oxide layer 114 conformally covers the buffer layer, the spacers 112 and the gate structures 106a in the logic circuit region 104a. The oxide layer 114 can be formed from silicon oxide by CVD, for example. The thickness of the oxide layer 114 can be varied based on the requirement for a manufacturing process of a logic circuit device. Preferably, the thickness of the oxide layer 114 is about 400–600 angstroms.

As shown in FIG. 1C, a portion of the oxide layer 114 and a portion of the buffer layer are removed to expose the top portion of the gate structures 106a and 106b and a portion of the substrate 100 in the logic circuit region 104a. The method for removing the portion of the oxide layer 114 and the portion of the buffer layer can be an etching back, for example. A portion of the remaining oxide layer 114 in the logic circuit region 104a is denoted as spacers 116 on the spacers 112. Hence, every spacer width in the logic circuit region 104a is the sum of the widths of the spacers 116 and 112. The other portion of the remaining oxide layer in the memory cell region 104b is denoted as a silicide block 118 located in the spaces between the gate structures 106b. Additionally, the exposed substrate 100 is exposed by the spacers 116, 112 and the gate structures 106a in the logic circuit region 104a.

Source/drain regions 119 are formed in the substrate 100 exposed by the spacers 116, 112 and the gate structures 106a in the logic circuit region 104a. The method of forming the source/drain regions 119 can be an ion implantation process, for example. Since the silicide block 118 is located in the spaces between the gate structures 106b in the memory cell region 104b, the source/drain regions is not formed in the memory cell region 104b.

A self-aligned silicide process is performed to form a silicide layer 120 on the substrate exposed by the spacers 116, 112 and the gate structures 106a above the source/drain regions 119 in the logic circuit region 104a. In this example, the self-aligned silicide process comprises the steps of forming a conductive layer (not shown) over the substrate 100. Preferably, the conductive layer can be made of refractory metal. Suitable refractory metals include titanium, tungsten, cobalt, nickel, platinum and palladium, for example. A rapid thermal process is used to perform the silylation between the metal atoms and the silicon atoms to form the silicide layer 120. The conditions for performing the rapid thermal process are a temperature about of 650–750° C. and an environment filled with nitrogen gas. The silicide layer 120 can be a titanium silicon layer or a cobalt silicon layer, for example. The portions of the conductive layer not engaging the silylation are stripped away to expose the silicide layer 120 between the gate structures 106a. The method for stripping away the portions of the conductive layer can be a wet etching, for example. Capacitors (not shown) are formed in the memory cell region 104b. The method for forming the capacitors is a well-known technique, so that it is not described herein.

Since the silicide block 118 is formed to fill the spaces between the gate structures 106b, the silicide layer is not formed in the memory cell region 104b. Therefore, the subsequently formed capacitor in the memory cell region 104b can maintain a relatively long refreshing cycle. Moreover, because the silicide block 118 can protect the memory cell region 104b from forming the silicide layer, the formation of silicon nitride layer and the performance of the photolithography process in the conventional manufacturing process for avoiding the formation of the silicide layer in the memory cell region 104b can be skipped.

Altogether, the invention includes the following advantages:

1. In the invention, the spacers with different widths are formed by a two-step formation process to simultaneously meet the spacer width requirements of forming a logic circuit device and a memory device. Therefore, the operation performances of the logic circuit device and the memory device can be greatly improved.

2. In the invention, because the silicide block 118 formed in the spaces between the gate structures 106b can protect the memory cell region 104b from forming the silicide layer, the silicide layer 120 is merely formed in the logic circuit region 104a. Hence, the operation rate of the logic circuit device is increased and the subsequently formed capacitor in the memory cell region 104b possesses a relatively long refreshing cycle.

3. In the invention, the spacers 112 are used as LDD offset spacers, so that the overlay capacitor between the source/drain region and the gate structure is reduced. Therefore, the operation rate of the logic circuit device is increased and the hot carrier effect can be avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing an embedded memory with different spacer widths on a substrate having a memory cell region and a logic circuit region, wherein a plurality of first gate structures and a plurality of second gate structures are respectively formed on the substrate in the memory cell region and the logic circuit region, the method comprising the steps of:

forming a conformal buffer layer and a conformal nitride layer over the substrate in sequence;

removing a portion of the nitride layer to form a first spacer on a sidewall of each of the first gate structures and on a sidewall of each of the second gate structures;

forming doped regions in the substrate between the first spacer;

forming an oxide layer over the substrate, wherein the oxide layer fills spaces between the first gate structures;

removing a portion of the oxide layer and a portion of the buffer layer to form a second spacer on each of the first spacers in the logic circuit region and to simultaneously form a silicide block filling spaces between the first gate structures in the memory cell region;

forming a source/drain region in the substrate exposed by the second spacers, the first spacers and the second gate structures in the logic circuit region; and forming a silicide layer on the substrate exposed by the second spacers, the first spacers and the second gate structures in the logic circuit region.

2. The method of claim 1, wherein every space between the first gate structures is smaller than that between the second gate structures.

3. The method of claim 1, wherein the buffer layer is made of silicon oxide.

4. The method of claim 1, wherein a thickness of the nitride layer can be varied with requirements for forming a memory cell.

5. The method of claim 4, wherein a thickness of the nitride layer is of about 400–600 angstroms.

6. The method of claim 1, wherein a thickness of the oxide layer can be varied with requirements for forming a logic circuit device.

7. The method of claim 6, wherein a thickness of the oxide layer is of about 400–600 angstroms.

8. The method of claim 1, wherein doped regions are formed in the substrate exposed by the first spacer and the first gate structures in the memory cell while the lightly doped drain regions are formed in the logic circuit region.

9. The method of claim 1, wherein the suicide layer is made of titanium silicon.

10. The method of claim 1, wherein the silicide layer is made of cobalt silicon.

11. A method of manufacturing an embedded memory with different spacer widths on a substrate having a memory cell region and a logic circuit region, the method comprising the steps of:

forming a plurality of first gate structures and a plurality of second gate structures respectively on the substrate in the memory cell region and the logic circuit region, wherein a first space between the first gate structures is smaller than a second space between the second gate structures;

forming a first spacer over a sidewall of each of the first gate structures and over a sidewall of each of the second gate structures;

forming doped regions in the substrate between the first spacer;

forming a second spacer on the first spacer in the logic circuit region and simultaneously forming a silicide block filling, wherein the silicide block fills spaces between the first gate structures in the memory cell region;

forming a source/drain region in the substrate exposed by the second spacers, the first spacers and the second gate structures in the logic circuit region; and forming a silicide layer on the substrate exposed by the second spacers, the first spacers and the second gate structures in the logic circuit region.

12. The method of claim 11, wherein the step of forming the first spacer comprises the steps of:

forming a conformal nitride layer over the substrate; and removing a portion of the nitride layer to form the first spacer over the sidewall of each first gate structure and over the sidewall of each second gate structure.

13. The method of claim 12, wherein a thickness of the nitride layer can be varied with requirements for forming a memory cell.

14. The method of claim 13, wherein a thickness of the nitride layer is of about 400–600 angstroms.

15. The method of claim 11, wherein the step of forming the second spacer comprises the steps of:

forming an oxide layer over the substrate, wherein the oxide layer fills the spaces between the first gate structures; and removing a portion of the oxide layer to form the second spacer and to simultaneously form a silicide block.

16. The method of claim 15, wherein the thickness of the oxide layer can be varied with requirements for forming a logic circuit device.

17. The method of claim 16, wherein a thickness of the oxide layer is of about 400–600 angstroms.

18. The method of claim 1, wherein doped regions are formed in the substrate exposed by the first spacer and the first gate structures in the memory cell while the lightly doped drain regions are formed in the logic circuit region.

19. The method of claim 1, wherein the silicide layer is made of titanium silicon.

20. The method of claim 1, wherein the silicide layer is made of cobalt silicon.

21. A method of manufacturing an embedded memory with different spacer widths on a substrate having a memory cell region and a logic circuit region, the method comprising:

forming a plurality of first gate structures in the memory region and a plurality of second gate structures, wherein a first space between the first gate structures is smaller than a second space between the second gate structures;

forming a dielectric layer over the substrate, the first gate structures, and the second gate structures, wherein the first space is substantially filled but not the second space;

removing a portion of the dielectric layer to form a spacer only on a sidewall of the second gate structures and a dielectric silicide block between the first gate structures; and forming a silicide layer on the substrate between the spacer of the second gate structures.

22. The method of claim 21, wherein before the step of forming the dielectric layer, the method further comprises forming a doped region in the substrate between the first gate structures and the second gate structures.

* * * * *